US008507997B2

(12) United States Patent
Yang et al.

(10) Patent No.: US 8,507,997 B2
(45) Date of Patent: Aug. 13, 2013

(54) MASK READ-ONLY MEMORY HAVING A FAKE SELECT TRANSISTOR

(75) Inventors: Seung-Jin Yang, Seoul (KR); Yong-Tae Kim, Yongin-si (KR); Hyuck-Soo Yang, Seoul (KR); Jung-Ho Moon, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 85 days.

(21) Appl. No.: 13/050,241

(22) Filed: Mar. 17, 2011

(65) Prior Publication Data

US 2011/0316092 A1    Dec. 29, 2011

(30) Foreign Application Priority Data

Jun. 25, 2010  (KR) .................. 10-2010-0060569

(51) Int. Cl.
*H01L 21/70* (2006.01)
(52) U.S. Cl.
USPC ............. 257/390; 257/909; 257/E27.103; 365/185.11; 365/230.03; 438/130; 438/587
(58) Field of Classification Search
USPC ............. 257/202, 212, 213, 288, 368, 390, 257/909, E27.103, E27.108; 365/185.11, 365/185.17, 230.03; 438/128, 129, 130, 438/587, FOR. 212
See application file for complete search history.

(56) References Cited

U.S. PATENT DOCUMENTS

| | | | | |
|---|---|---|---|---|
| 5,990,507 A | * | 11/1999 | Mochizuki et al. | 257/295 |
| 2002/0031879 A1 | * | 3/2002 | Itoh et al. | 438/183 |
| 2002/0042182 A1 | | 4/2002 | Parris et al. | |
| 2006/0289943 A1 | * | 12/2006 | Yamada | 257/390 |
| 2008/0123388 A1 | * | 5/2008 | Scott et al. | 365/94 |
| 2009/0250735 A1 | * | 10/2009 | Asao | 257/295 |

FOREIGN PATENT DOCUMENTS

| | | |
|---|---|---|
| JP | 2003-338564 | 11/2003 |
| KR | 1020020046911 | 6/2002 |
| KR | 1020050066825 | 6/2005 |

OTHER PUBLICATIONS

English Abstract for Publication No. 1020020046911.
English Abstract for Publication No. 2003-338564.
English Abstract for Publication No. 1020050066825.

* cited by examiner

*Primary Examiner* — William D Coleman
*Assistant Examiner* — Su Kim
(74) *Attorney, Agent, or Firm* — F. Chau & Associates, LLC

(57) ABSTRACT

A mask read-only memory (ROM) includes parallel doping lines of a second conductivity type formed in a substrate of a first conductivity type, a first insulation film formed on the doping lines and the substrate, conductive pads fainted on the first insulation film, a second insulation film formed on the first insulation film and the conductive pads, parallel wires formed on the second insulation film extending perpendicular to the doping lines, contact plugs formed in the first insulation film that connect the doping lines to the conductive pads, and vias formed in the second insulation film that connect the conductive pads to the wires, wherein crossings of the doping lines and the wires define memory cells, contact plugs and vias are formed in memory cells of a first type, and at least one of the contact plug and via are missing from memory cells of a second type.

18 Claims, 17 Drawing Sheets

MASK READ-ONLY MEMORY HAVING A FAKE SELECT TRANSISTOR

CROSS-REFERENCE TO RELATED APPLICATION

This application claims priority under 35 U.S.C. 119 from Korean Patent Application No. 10-2010-0060569 filed on Jun. 25, 2010 in the Korean Intellectual Property Office, the contents of which are herein incorporated by reference in their entirety.

BACKGROUND

1. Technical Field

The present disclosure is directed to a mask ROM.

2. Description of the Related Art

In systems that use a memory, in particular a mask read-only memory (ROM), for which some type of security is typically required, code data stored in a mask ROM should be prevented from being physically hacked.

In a conventional mask ROM, it is possible to analyze code data by monitoring an output of a sense amplifier, a bit line or a data line. Also, in the case of a mask ROM that uses a metal contact plug or via, it is possible to interpret code data by analyzing a contact plug layer or a via layer.

SUMMARY

Embodiments of the present disclosure provide a security-reinforced mask ROM that prevents code data stored in a mask ROM cell array from being physically hacked.

According to an aspect of the present disclosure, there is provided a mask ROM including a plurality of doping lines of a second conductivity type formed in a substrate of a first conductivity type and spaced apart from each other in parallel, a first insulation film formed on the doping lines and the substrate, a plurality of conductive pads formed on the first insulation film, a second insulation film formed on the first insulation film and the conductive pads, a plurality of wires formed on the second insulation film, spaced apart from each other in parallel, and extending perpendicular to the doping lines, a plurality of contact plugs formed in the first insulation film and electrically connecting the doping lines to at least some of the conductive pads, and a plurality of vias formed in the second insulation film and electrically connecting at least some of the conductive pads to the wires, wherein crossings of the doping lines and the wires define memory cells, wherein the contact plugs and the vias are formed in memory cells of a first type, and at least one of the contact plug and the via are missing from memory cells of a second type.

According to another aspect of the present disclosure, there is provided a mask ROM including a plurality of doping lines of a second conductivity type formed in a substrate of a first conductivity type and spaced apart from each other in parallel, first and second insulation films sequentially formed on the doping lines and the substrate, a plurality of wires formed on the second insulation film, spaced apart from each other in parallel, and extending perpendicular to the doping lines, and a plurality of conductive pads formed on the first insulation film to correspond to crossings of the doping lines and the wires, wherein the crossings of the doping lines and the wires define memory cells, wherein memory cells of a first type have the doping lines electrically connected to the wires, and memory cells of a second type have the doping lines electrically disconnected from the wires, wherein the electrical connections comprise a connection between the doping lines and the conductive pads, and a connection between the conductive pads and the wires.

According to another aspect of the present disclosure, there is provided a method of fabricating a mask ROM, including etching a substrate using a mask pattern to form trenches separating active regions, filling the trenches to form an isolation film, implanting impurity ions of a second conductivity type into the active regions to form doping lines, forming a first insulation film on the entire surface of the substrate and the doping lines, forming first contact holes in the first insulation film to expose predetermined regions of the doping lines, filling a conductive material into the first contact holes to form contact plugs, forming conductive pads at preselected locations on the first insulation film, forming a second insulation film on the entire surface of the substrate and the conductive pads, forming second contact holes exposing predetermined conductive pads, filling a conductive material into the second contact holes to form vias, and patterning a conductive material formed on the second insulation film to form wires crossing the doping lines at locations corresponding to those of the conductive pads.

DETAILED DESCRIPTION OF EXEMPLARY EMBODIMENTS

Figure 1:
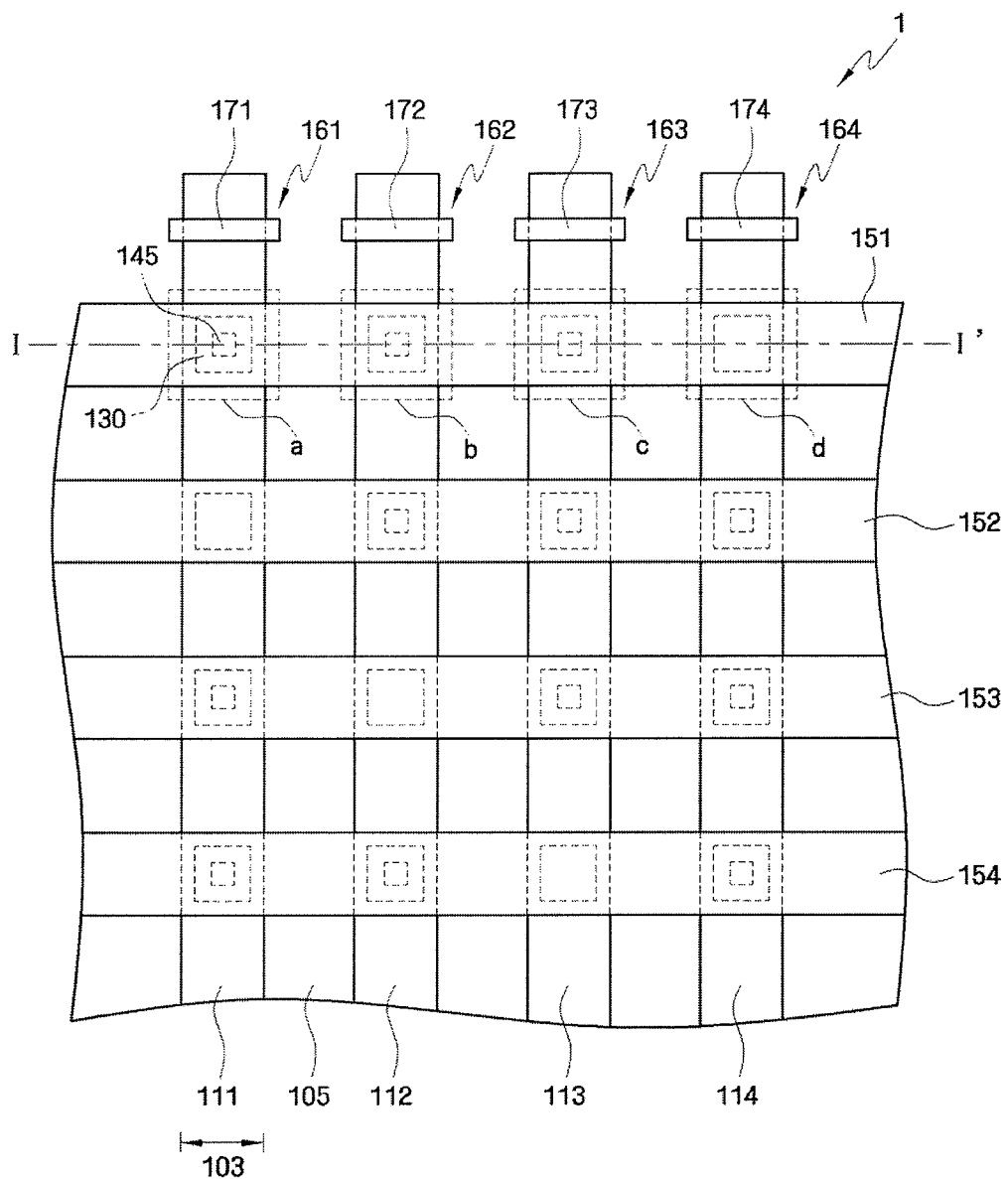
FIG. 1 is a plan view of a mask ROM according to an embodiment of the present disclosure.

Features of embodiments of the present disclosure and methods of accomplishing the same may be understood more readily by reference to the following detailed description of exemplary embodiments and the accompanying drawings. Embodiments of the present disclosure may, however, be embodied in many different forms and should not be construed as being limited to the embodiments set forth herein. In the drawings, the size and relative sizes of layers and regions may be exaggerated for clarity. It will be understood that when an element or layer is referred to as being "on," or "connected to" another element or layer, it can be directly on or connected to the other element or layer or intervening elements or layers may be present. Like numbers refer to like elements throughout.

Hereinafter, a mask ROM according to an embodiment of the present disclosure will be described with reference to FIGS. 1 and 2. FIG. 1 is a plan view of a mask ROM according to an embodiment of the present disclosure, and FIG. 2 is a sectional view taken along the line I-I' of FIG. 1.

Figure 2:
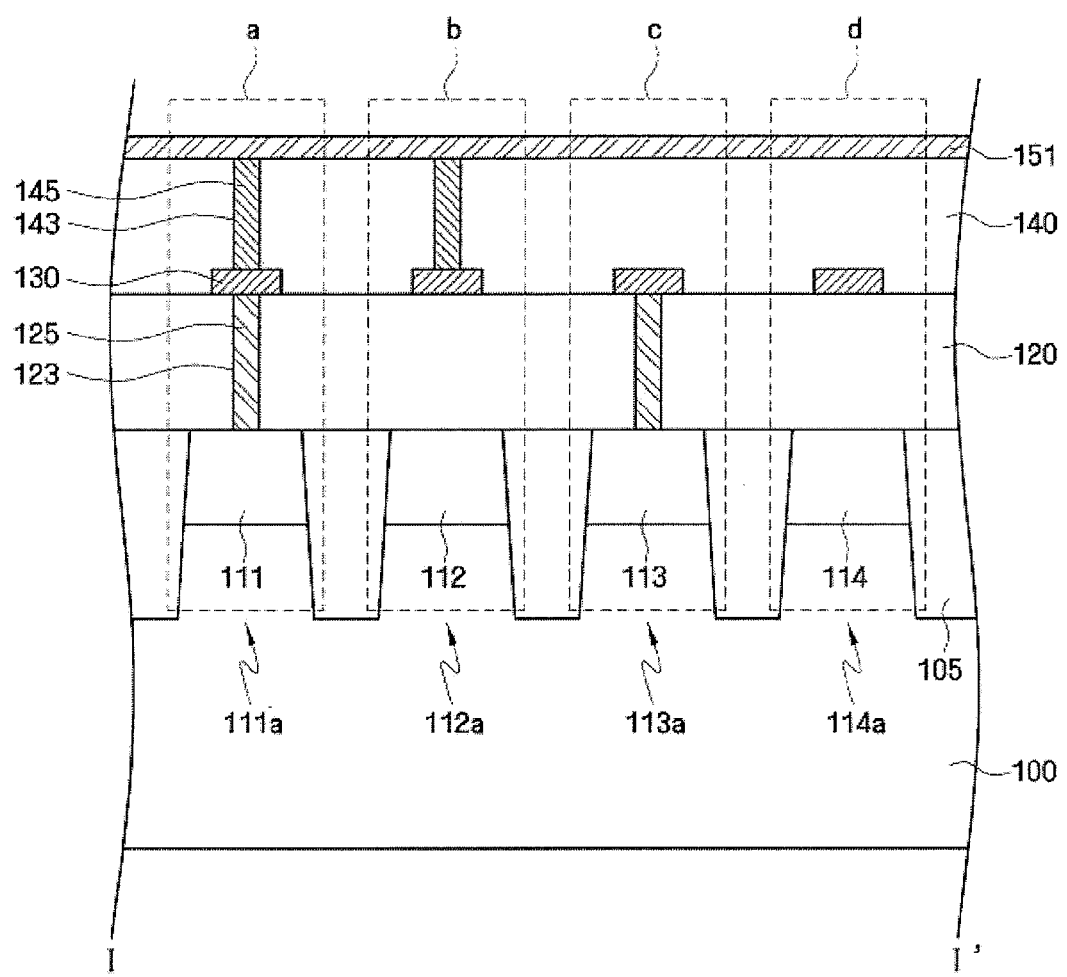
FIG. 2 is a sectional view taken along the line I-I' of FIG. 1.

Referring to FIGS. 1 and 2, a mask ROM 1 includes an isolation layer 105 formed on a substrate 100 to separate active regions 103. The active regions 103 may be of, for example, a line type, and may be formed parallel with each other. The isolation layer 105 may be a field oxide (FOX) layer formed using a local oxidation of silicon (LOCOS) technique or a shallow trench isolation (STI) layer. The substrate 100 may be doped with a first conductivity type impurity. Multiple wells of the isolation layer 105 may be formed in the substrate 100.

Doping lines 111, 112, 113, and 114 doped with a second conductivity type impurity are formed in the active regions 103. If the first conductivity type is a P type, the second conductivity type is an N type, and vice versa. Each of the doping lines 111, 112, 113, and 114 may have a line shape extending along the active regions 103. The doping lines 111, 112, 113, and 114 may be spaced apart from and parallel to each other in the substrate 100, and the isolation layer 105 is positioned between adjacent doping lines 111, 112, 113, and 114.

First decoders 161, 162, 163, and 164 may be formed connected to one end of the doping lines 111, 112, 113, and 114, respectively. The first decoders 161, 162, 163, and 164 are used to address the doping lines 111, 112, 113, and 114 and may be formed of select transistors. The first decoders 161, 162, 163, and 164 may have first gate electrodes 171, 172, 173, and 174 corresponding to the doping lines 111, 112, 113, and 114, respectively.

A first insulation film 120 is formed on the entire surface of the substrate 100 having the doping lines 111, 112, 113, and 114. The first insulation film 120 may be formed of a silicon oxide film.

A plurality of conductive pads 130 are formed on a surface of the first insulation film 120. The conductive pads 130 are formed at regions that will correspond to memory cell regions that will be defined by crossings of the doping lines 111, 112, 113, and 114 and wires 151, 152, 153, and 154, that are not yet formed. The conductive pads 130 are formed at the respective regions where the doping lines 111, 112, 113, and 114 and each of the wires 151, 152, 153, and 154 will cross each other.

First contact holes 123 exposing predetermined areas of the doping lines 111 and 113 are selectively formed in the first insulation film 120, and contact plugs 125 for electrically connecting the doping lines 111 and 113 and the conductive pads 130 to each other are formed in the first contact holes 123.

A second insulation film 140 is formed on the conductive pad 130 and the first insulation film 120. The wires 151, 152, 153, and 154 are formed on a surface of the second insulation film 140. The wires 151, 152, 153, and 154 extend perpendicular to and cross over the doping lines 111, 112, 113, and 114. The wires 151, 152, 153, and 154 are spaced apart from and parallel to each other. The wires 151, 152, 153, and 154 may be bit lines from which data is output, and may be connected to a sense amplifier.

Second contact holes 143 exposing predetermined areas of the conductive pads 130 are selectively formed in the second insulation film 140, and vias 145 for electrically connecting the wires 151, 152, 153, and 154 to the conductive pads 130 are formed in the second contact holes 143.

The contact plugs 125, the conductive pads 130, the vias 145, and the wires 151, 152, 153, and 154 may be made of a metal such as tungsten or molybdenum, a metal nitride such as titanium nitride or tantalum nitride, or a metal silicide such as tungsten silicide, titanium silicide, nickel silicide, or cobalt silicide. The contact plugs 125, the conductive pads 130, the vias 145, and the wires 151, 152, 153, and 154 may be made from different materials, although some of them may be made from the same material.

The crossings of the doping lines 111, 112, 113, and 114 and the wires 151, 152, 153, and 154 define a plurality of memory cells a, b, c, and d. The plurality of memory cells a, b, c, and d may be arranged in a 2-dimensional rectangular array on the substrate 100, with directions parallel with the doping lines 111, 112, 113, and 114 being defined as column-wise directions, and directions parallel with the wires 151, 152, 153, and 154 being defined as row-wise directions.

Diodes 111a, 112a, 113a, and 114a are formed in regions of the substrate 100 under the doping lines 111, 112, 113, and 114, respectively, corresponding to the memory cells a, b, c, and d.

The memory cells a, b, c, and d may be divided into on-memory cells (for example, first type memory cells), and off-memory cells (for example, second type memory cells) according to whether the doping lines 111, 112, 113, and 114 and the wires 151, 152, 153, and 154 are electrically connected. In the exemplary, non-limiting embodiment depicted in FIG. 2, memory cell a is an on-memory cell, and memory cells b, c, and d are off-memory cells. However, this selection of on-memory cells and off-memory cells may differ in other embodiments of the disclosure.

In this embodiment, the off-memory cells b, c, and d may be implemented in three ways. That is to say, the off-memory cells b, c, and d may be formed by not forming at least one of the contact plugs 125 and vias 145. Specifically, the doping line 112 and an electrode pad 130 are electrically disconnected from each other by not forming the contact plug 125, implementing the off-memory cell b. In addition, the electrode pad 130 and the wire 151 are electrically disconnected from each other by not forming the via 145, implementing the off-memory cell c. Alternatively, the doping line 114 and the wire 151 are electrically disconnected from each other by not forming both the contact plug 125 and the via 145, implementing the off-memory cell d.

A logic "1" data is stored in one of the memory cells a, b, c, and d, and a logic "0" data is stored in the others, thereby coding code data in a mask ROM 1.

In a mask ROM using a contact plug or a via formed in an insulation film, the code data stored in the mask ROM can be analyzed by visually determining the presence or absence of the contact plug or the via.

However, in a mask ROM 1 according to an embodiment of the present disclosure, the code data stored thereon is not easily analyzed. In detail, referring to FIG. 1, when the mask ROM 1 is visually observed from above, the wires 151, 152, 153, and 154 hinder determining the presence of the contact plugs 125 and vias 145. The presence of the vias 145 can be determined by eliminating the wires 151, 152, 153, and 154. However, even if the vias 145 are present in the memory cells a and b, one of the memory cells a and b, e.g., the memory cell a, may be an on-memory cell and the other, e.g., the memory cell b, may be an off-memory cell. Thus, it is not possible to analyze the code data based only on the presence of the via 145. In addition, even if the second insulation film 140 and the vias 145 are eliminated, the presence or absence of the contact plugs 125 cannot be determined due to the conductive pads 130. The code data may finally be analyzed by eliminating the conductive pad 130.

Therefore, in a mask ROM 1 according to an embodiment of the disclosure, the doping lines 111, 112, 113, and 114 are connected to the wire 151 by a combination of the contact plugs 125 and vias 145, implementing the on/off-memory cells. In such a manner, the complexity of visually analyzing the code data stored on the mask ROM can be increased.

Figure 3:
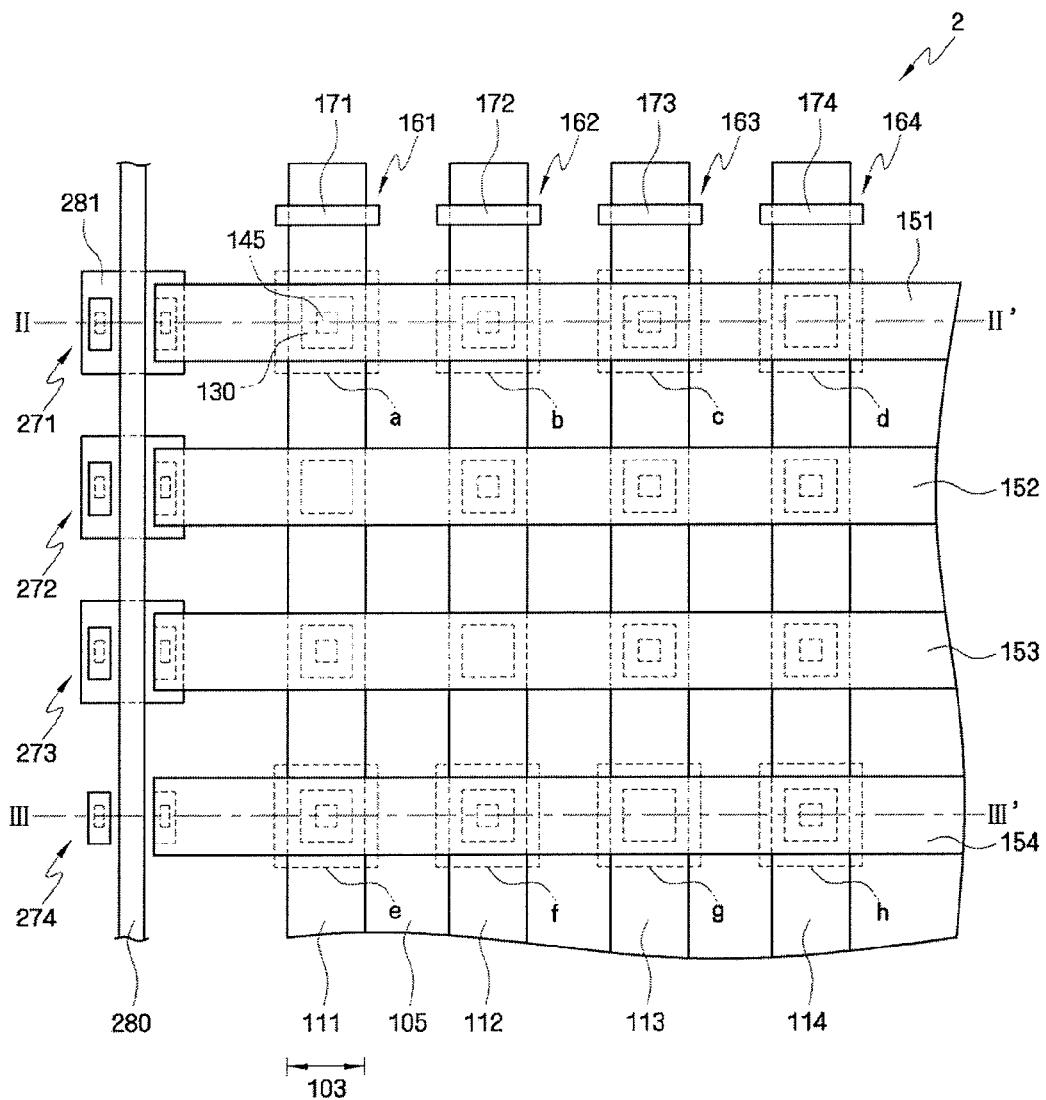
FIG. 3 is a plan view of a mask ROM according to another embodiment of the present disclosure.
Figure 4:
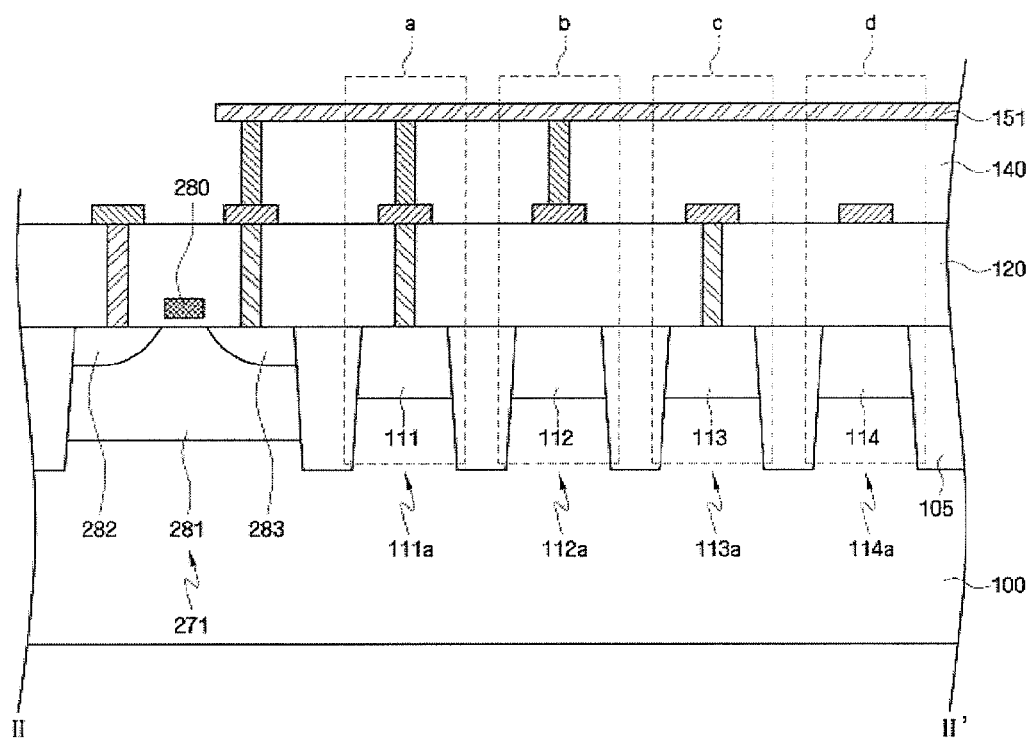
FIG. 4 is a sectional view taken along the line II-II' of FIG. 3.
Figure 5:
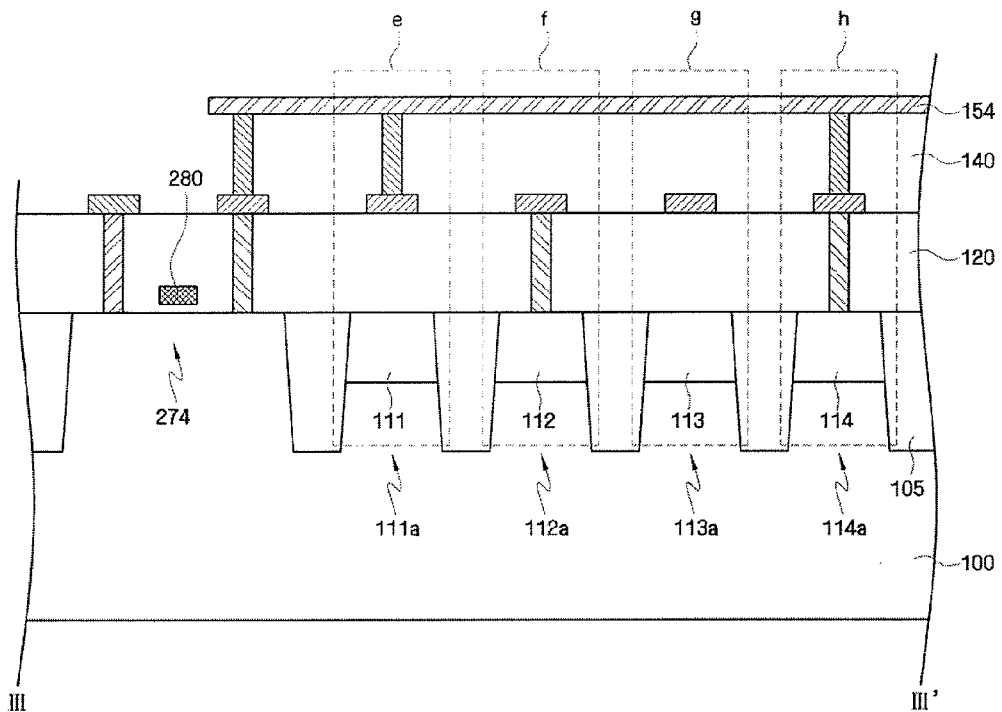
FIG. 5 is a sectional view taken along the line III-III' of FIG. 3.
Figure 6:
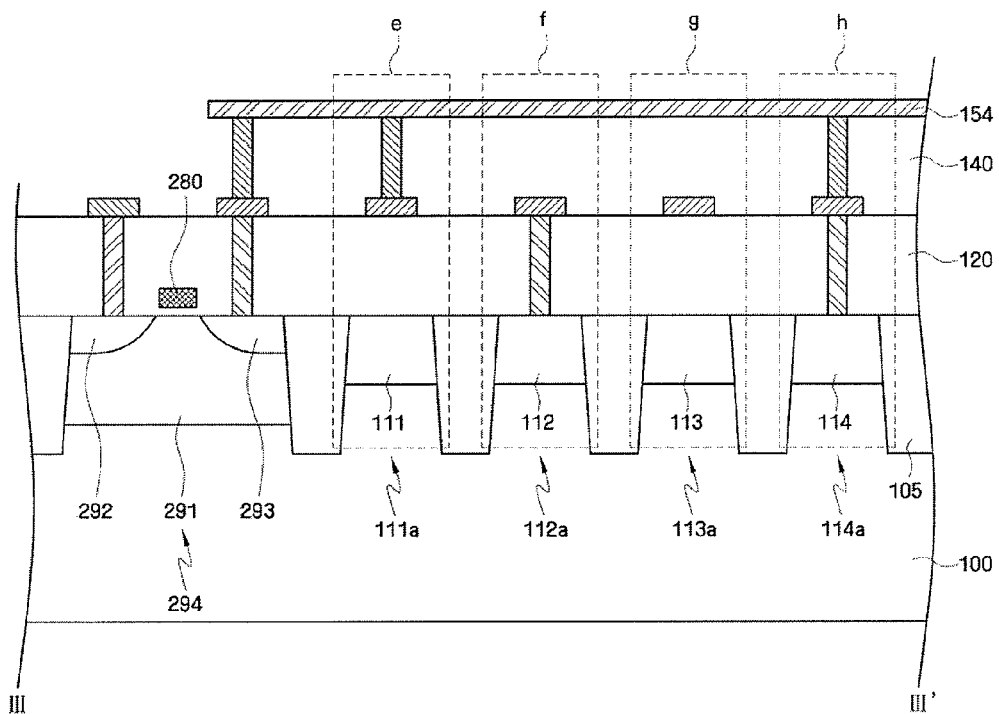
FIG. 6 is a sectional view illustrating a modified example of FIG. 5.

A mask ROM according to another embodiment of the present disclosure will now be described with reference to FIGS. 3 through 6. FIG. 3 is a plan view of a mask ROM according to another embodiment of the present disclosure, FIG. 4 is a sectional view taken along the line of FIG. 3, FIG. 5 is a sectional view taken along the line III-III' of FIG. 3, and FIG. 6 is a sectional view illustrating a modified example of FIG. 5. The same reference numerals are used to refer to substantially the same elements as those shown in FIGS. 1 and 2, and detailed explanation thereof may be omitted.

Referring to FIGS. 3 through 5, a mask ROM 2 according to an embodiment of the present disclosure differs from a mask ROM 1 according to a previous embodiment of the present disclosure in that second decoders 271, 272, 273, and 274 are formed connected to one end of the respective wires 151, 152, 153, and 154. The second decoders 271, 272, 273, and 274 may be connected to sense amplifiers.

The second decoders 271, 272, 273, and 274 may be formed of pass transistors. Here, the second decoders 271, 272, 273, and 274 share a second gate electrode 280, and at least one second decoder includes a fake pass transistor. In the exemplary, non-limiting embodiment depicted in FIG. 3, the second decoder with the fake pass transistor is reference number 274, however, this selection may differ in other embodiments of the disclosure. The second decoder 274 is always turned on or off regardless of the voltage applied to the second gate electrode 280. As a result, in analyzing the code data stored in the mask ROM 2, the memory cells e, f, g, and h connected to the second decoder 274 may be either on-memory cells if the second decoder 274 is turned on, or off-memory cells if the second decoder 274 is turned off.

Referring to FIG. 4, second decoder 271 formed of a pass transistor includes a well 281 formed in a substrate 100, and source/drain regions 282 and 283 formed in the well 281. In addition, one region 283 of the source/drain regions 282 and 283 is electrically connected to the wire 151 through the contact plug 125 and via 145.

However, referring to FIG. 5, the second decoder 274 formed of a fake pass transistor does not have the well or the source/drain regions formed in the substrate 100. In the fake pass transistor second decoder 274, a channel is not formed regardless of the voltage applied to the second gate electrode 280. As a result, the fake pass transistor second decoder 274 is always turned off.

The memory cell h of the memory cells e, f, g, and h connected to the fake pass transistor second decoder 274 is an on-memory cell having both a via 145 and a contact plug 125 formed therein, while memory cells e, f, and g are off-memory cells due to missing vias 145 or contact plugs 125. For example, when logic "1" data is stored in the memory cell h and logic "0" data is stored in the other memory cells e, f, and g, the code data of the memory cells e, f, g, and h connected to the second decoder 274 will be read as "0, 0, 0, and 0", i.e. off-memory cells, when analyzing the code data stored in the mask ROM 2, which are different from the code data that is actually stored in the mask ROM 2. Therefore, the complexity of analyzing the code data can be increased. In addition, the complexity of distinguishing between the fake pass transistor and the pass transistor hinders the visual analysis of the code data.

Referring to FIG. 6, a fake pass transistor second decoder 294 may also be formed of a transistor including a well 291 and source/drain regions 292 and 293, using a MOS transistor having a different conductivity type from that of the second decoder (271 of FIG. 4). For example, the second decoder (271 of FIG. 4) may be formed of a first conductivity type MOS transistor (e.g., a PMOS transistor), and the second decoder 294 may be formed of a second conductivity type MOS transistor (e.g., an NMOS transistor), forming second decoder 294 having a fake pass transistor. Alternatively, a fake pass transistor second decoder 294 may be formed using a different doping concentration for the well 291 forming the second decoder 294 than for the well 281 forming the second decoder 271, so that the threshold voltage of the second decoder 294 differs from that of the second decoder (271 of FIG. 4). Alternatively, additional impurity implantation may be further performed to make the threshold voltage of the second decoder 294 greater than the voltage applied to the second gate electrode 280. Here, since the threshold voltage of the second decoder 294 is greater than the voltage applied to the second gate electrode 280, the second decoder 294 is always turned off regardless of the voltage applied to the second gate electrode 280.

Figure 7:
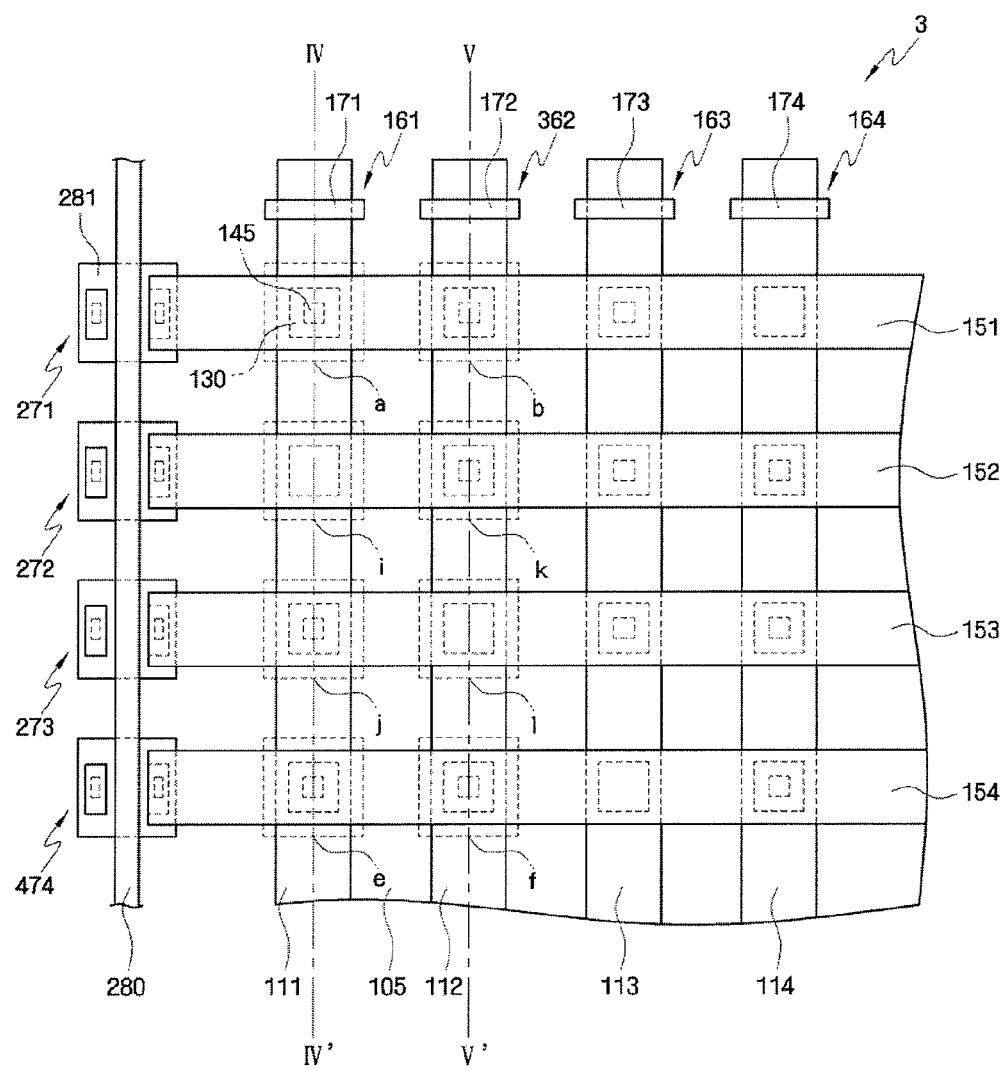
FIG. 7 is a plan view of a mask ROM according to still another embodiment of the present disclosure.
Figure 8:
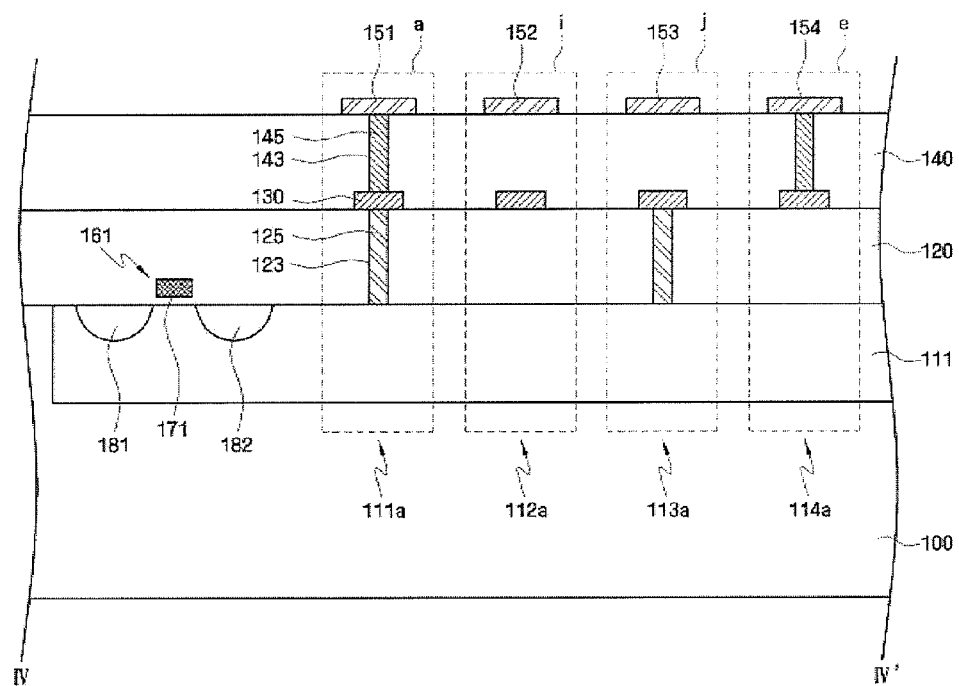
FIG. 8 is a sectional view taken along the line IV-IV' of FIG. 7.
Figure 9:
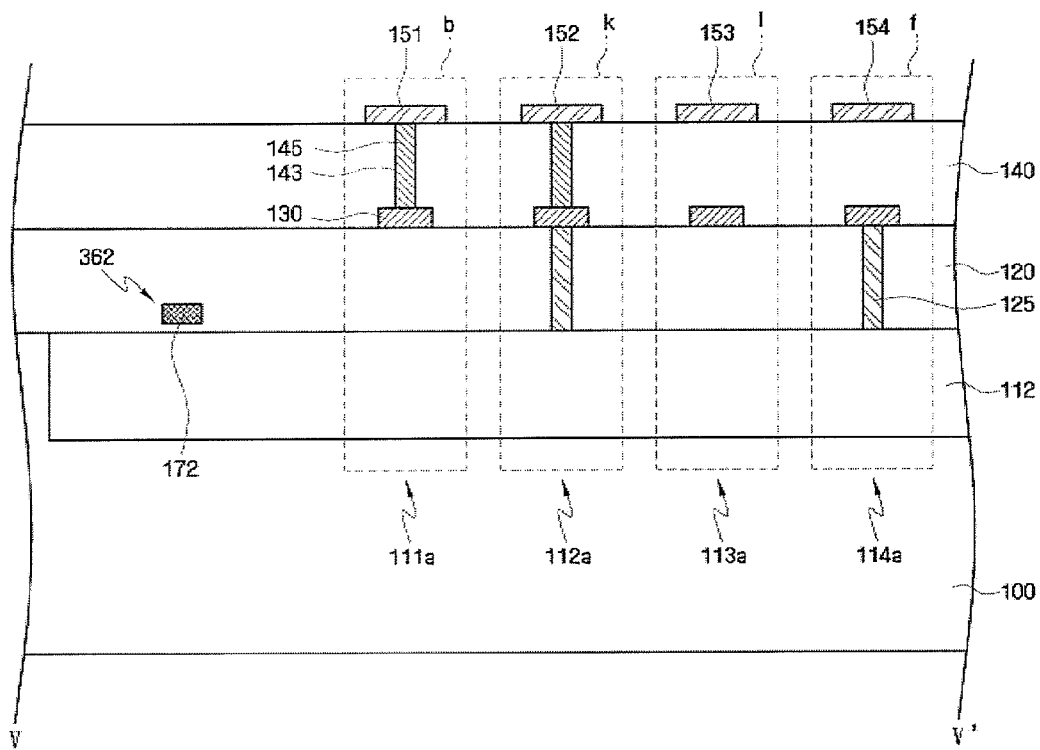
FIG. 9 is a sectional view taken along the line V-V' of FIG. 7.
Figure 10:
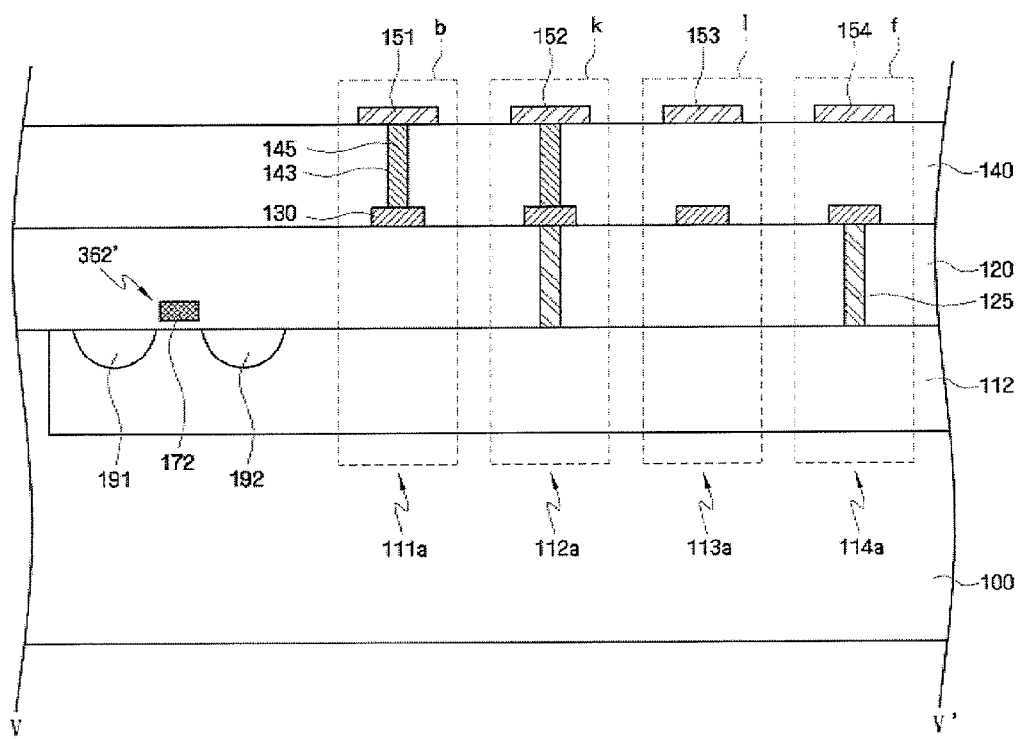
FIG. 10 is a sectional view illustrating a modified example of FIG. 9.

A mask ROM according to still another embodiment of the present disclosure will now be described with reference to FIGS. 7 through 10. FIG. 7 is a plan view of a mask ROM according to another embodiment of the present disclosure, FIG. 8 is a sectional view taken along the line IV-IV' of FIG. 7, FIG. 9 is a sectional view taken along the line V-V' of FIG. 7, and FIG. 10 is a sectional view illustrating a modified example of FIG. 9. The same reference numerals are used to refer to substantially the same elements as those shown in FIGS. 1 through 6, and detailed explanation thereof may be omitted.

Referring to FIGS. 7 through 9, a mask ROM 3 according to still another embodiment of the present disclosure differs from a mask ROM 2 according to a previous embodiment in that at least one first decoder 362 among the first decoders 161, 362, 163, and 164 positioned at one end of doping lines 111, 112, 113, and 114 is formed of a fake select transistor. In addition, second decoders 271, 272, 273, and 474 are formed of pass transistors and are respectively connected to one end of the wires 151, 152, 153, and 154. The mask ROM 3 further includes memory cells a, i, j, and e formed along doping line 111, and memory cells b, k, l, and f formed along doping line 112.

Referring to FIG. 8, the first decoder 161 formed of a select transistor includes source/drain regions 181 and 182 formed in the doping line 111. Referring to FIG. 9, the first decoder 362 formed of a fake select transistor does not include source/drain regions formed in the doping line 112. Therefore, a channel is not formed in the fake select transistor first decoder 362 irrespective of the voltage applied to the first gate electrode 172. Consequently, the fake select transistor first decoder 362 is always turned off.

When a predetermined voltage is applied to the first gate electrode 172 for addressing the doping line 112 to analyze the code data of the mask ROM 3, the doping line 112 appears to be addressed, but the doping line 112 is not actually addressed by the fake select transistor first decoder 362. In analyzing the code data, an on-memory cell k apparently connected to the first decoder 362 may function as an off-memory cell. Therefore, in analyzing the code data in the memory cells b, k, l, and f connected to the first decoder 362, the code data is read as "0, 0, 0, 0". That is to say, the code data as analyzed differs from the code data as actually stored, hindering the analysis of the code data. In addition, the visual indistinguishability of the fake select transistor and the select transistor hinders the visual analysis of the code data.

Referring to FIG. 10, a fake select transistor first decoder 362' may also be formed of a transistor having source/drain regions 191 and 192 using a MOS transistor of a different conductivity type from that of the first decoder (161 of FIG. 9). For example, the first decoder (161 of FIG. 9) may be formed of a first conductivity type MOS transistor (e.g., a PMOS transistor) and the first decoder 362' may be formed of a second conductivity type MOS transistor (e.g., an NMOS transistor), to form a fake select transistor first decoder 362'. Alternatively, a fake select transistor first decoder 362' may be formed using a different doping concentration for a channel region of the first decoder 362', that is, a predetermined region of the doping line 112 positioned between the source/drain regions 191 and 192, different from that of a predetermined region of the doping line 111 positioned between the source/drain regions 181 and 182, so that the threshold voltage of the first decoder 362' differs from that of the first decoder (161 of FIG. 9). Alternatively, an additional impurity implantation may be further performed, to make the threshold voltage of the first decoder 362' greater than the voltage applied to the first gate electrode 172. Here, since the threshold voltage of the first decoder 362' is greater than the voltage applied to the first gate electrode 172, the first decoder 362' is always turned off regardless of the voltage applied to the first gate electrode 172.

Figure 11:
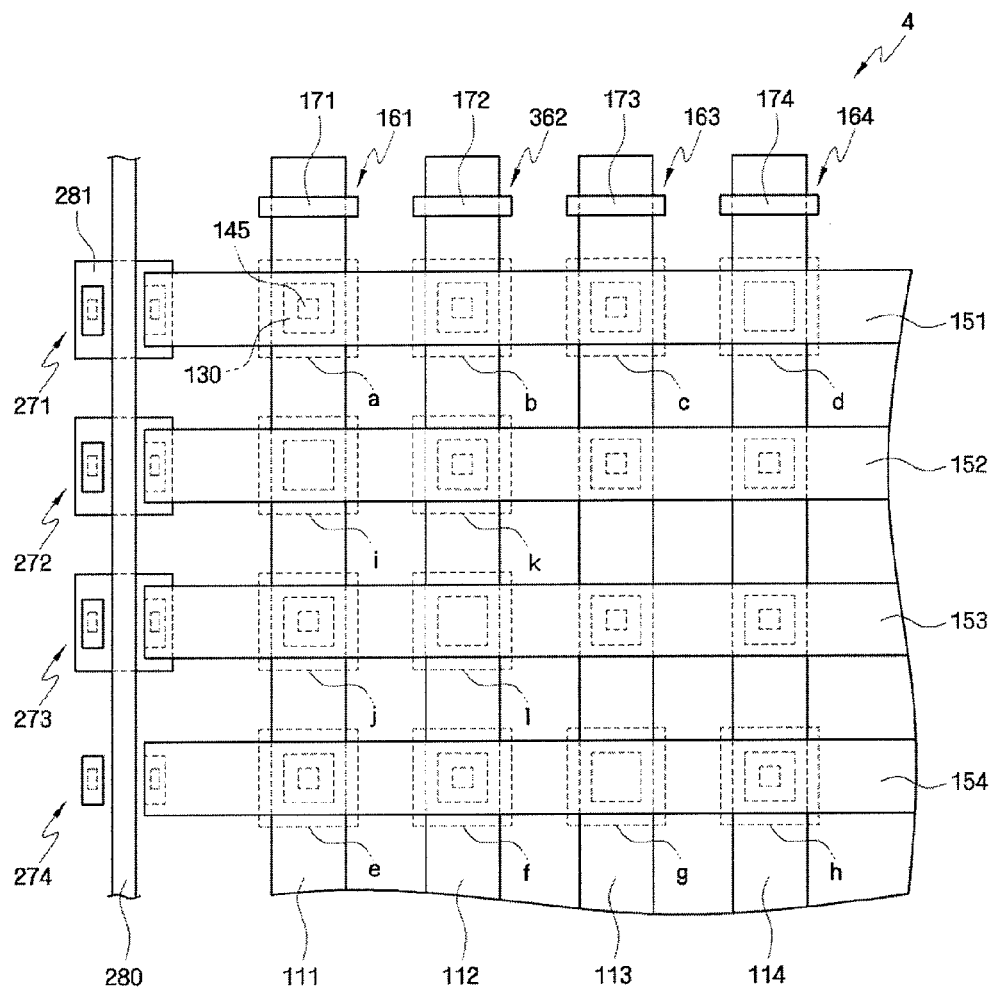
FIG. 11 is a plan view of a mask ROM according to still another embodiment of the present disclosure.

A mask ROM according to still another embodiment of the present disclosure will now be described with reference to FIG. 11. FIG. 11 is a plan view of a mask ROM according to still another embodiment of the present disclosure. The same reference numerals are used to refer to substantially the same elements as those shown in FIG. 10, and detailed explanation thereof may be omitted.

Referring to FIG. 11, in a mask ROM 4 according to still another embodiment of the present disclosure, at least one first decoder 362 among first decoders 161, 362, 163, and 164 positioned at one end of doping lines 111, 112, 113, and 114 is formed of a fake select transistor, and at least one second decoder 274 among second decoders 271, 272, 273, and 274 positioned at one end of wires 151, 152, 153, and 154 is formed of a fake pass transistor.

A method for forming a mask ROM according to an embodiment of the present disclosure will now be described with reference to FIGS. 2 and 12 through 16. FIGS. 12 through 16 are sectional views sequentially illustrating processing steps of a method for forming the mask ROM shown in FIG. 2. The same reference numerals are used to refer to substantially the same elements as those shown in FIG. 2, and detailed explanation thereof may be omitted.

Figure 12:
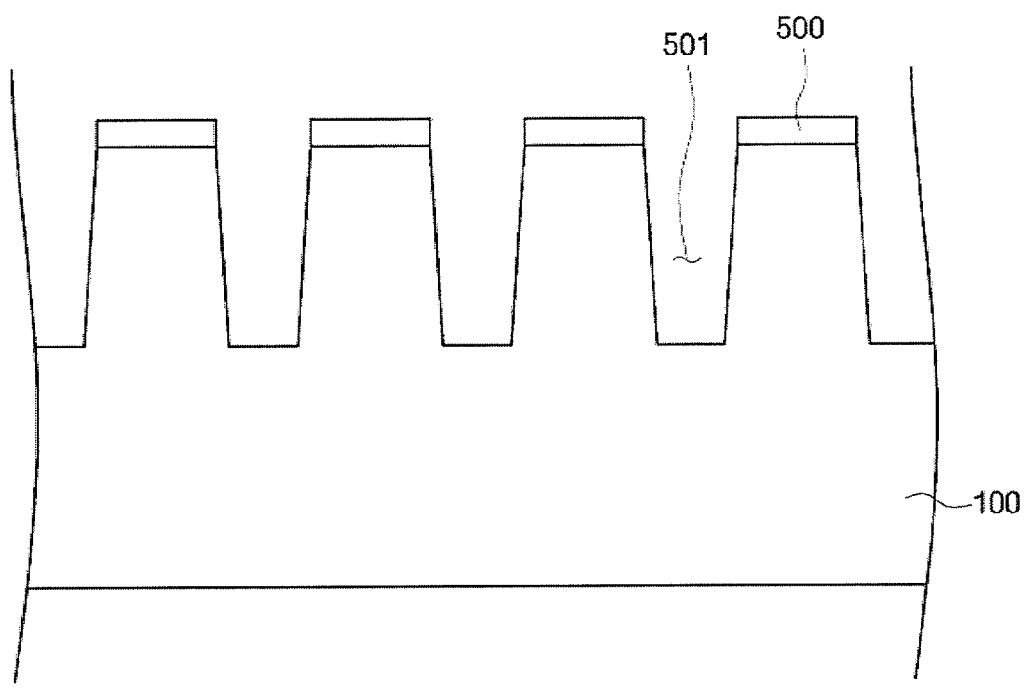
FIGS. 12 through 16 are sectional views sequentially illustrating processing steps of a method for forming the mask ROM shown in FIG. 2.

Referring to FIG. 12, a mask pattern 500 is foamed on a substrate 100, and the substrate 100 is etched using the mask pattern 500 as an etch mask, thereby forming trenches 501 that separate the active regions (103 of FIG. 1).

Figure 13:
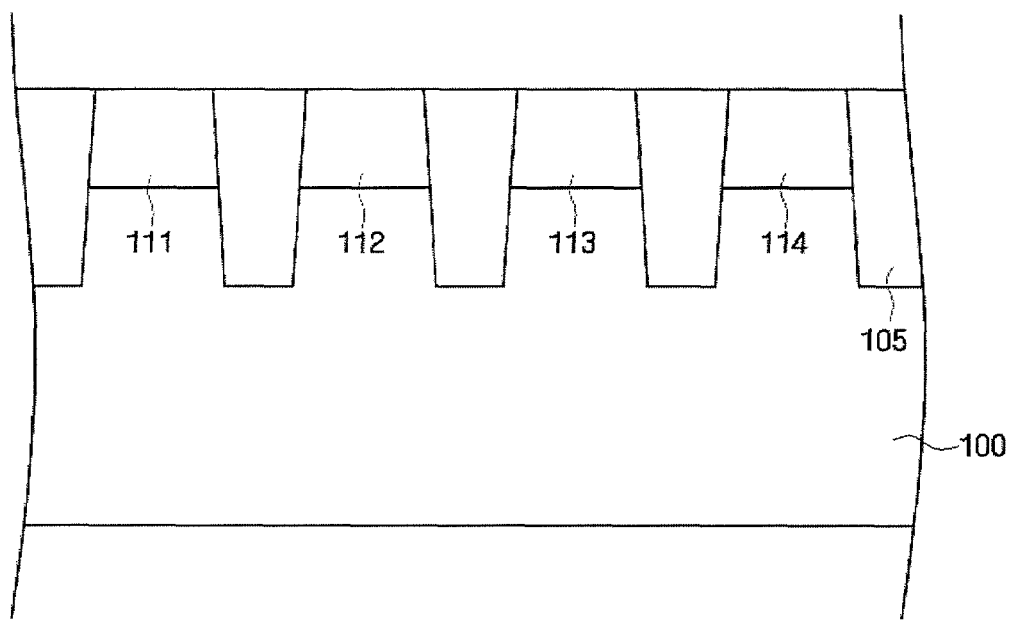

Referring to FIG. 13, the trenches 501 are filled to form an isolation film 105. The isolation film 105 may be formed of a high-density plasma silicon oxide film having gap-filling properties.

The substrate 100 is doped by implanting impurity ions of a first conductivity type into the substrate 100 during a well formation process. The well formation process may be performed either before or after forming the isolation film 105. Alternatively, the substrate 100 may be doped with the first conductivity type impurity while preparing the substrate 100.

Impurity ions of a second conductivity type are implanted into the active regions (103 of FIG. 1) to form the doping lines 111, 112, 113, and 114. After implanting the second conductivity type impurities, heat treatment may be performed to activate the implanted impurities.

Figure 14:
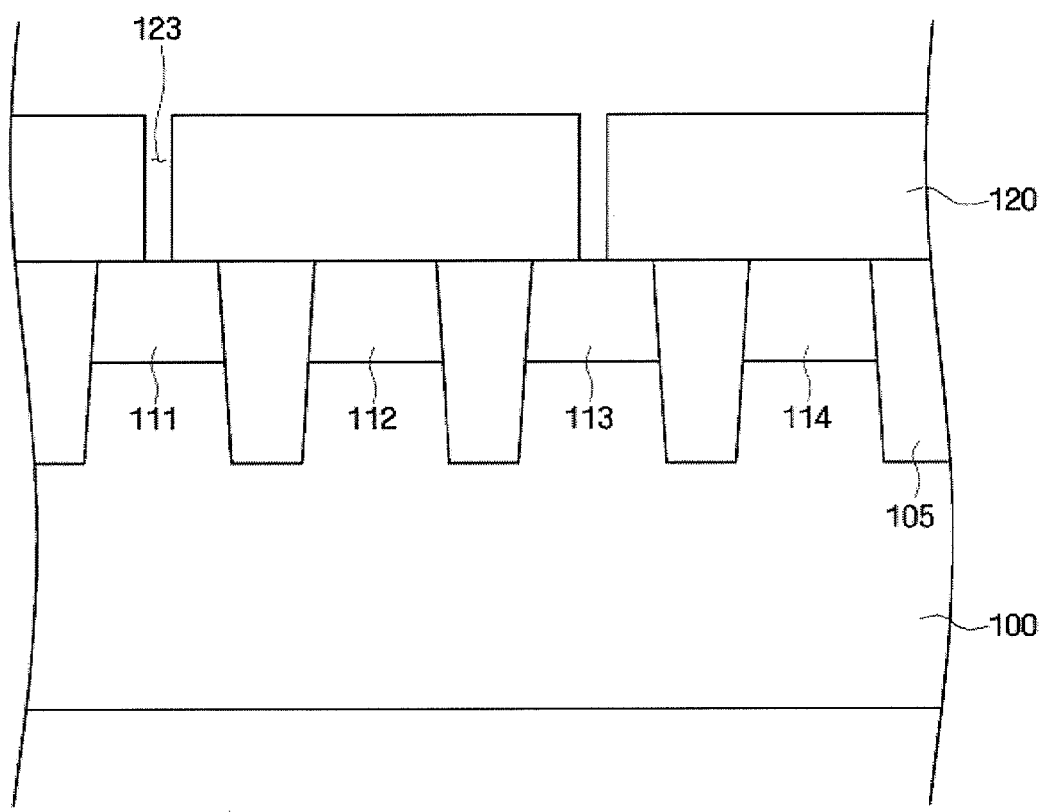

Referring to FIG. 14, a first insulation film 120 is formed on the entire surface of the substrate 100 having the doping lines 111, 112, 113, and 114. The first insulation film 120 may be formed of a silicon oxide film using chemical vapor deposition (CVD).

Subsequently, first contact holes 123 exposing predetermined regions of the doping lines 111 and 113 are formed to define cells to be selected according to the code data received from a consumer, etc. The first contact holes 123 may be formed by patterning the first insulation film 120.

Figure 15:
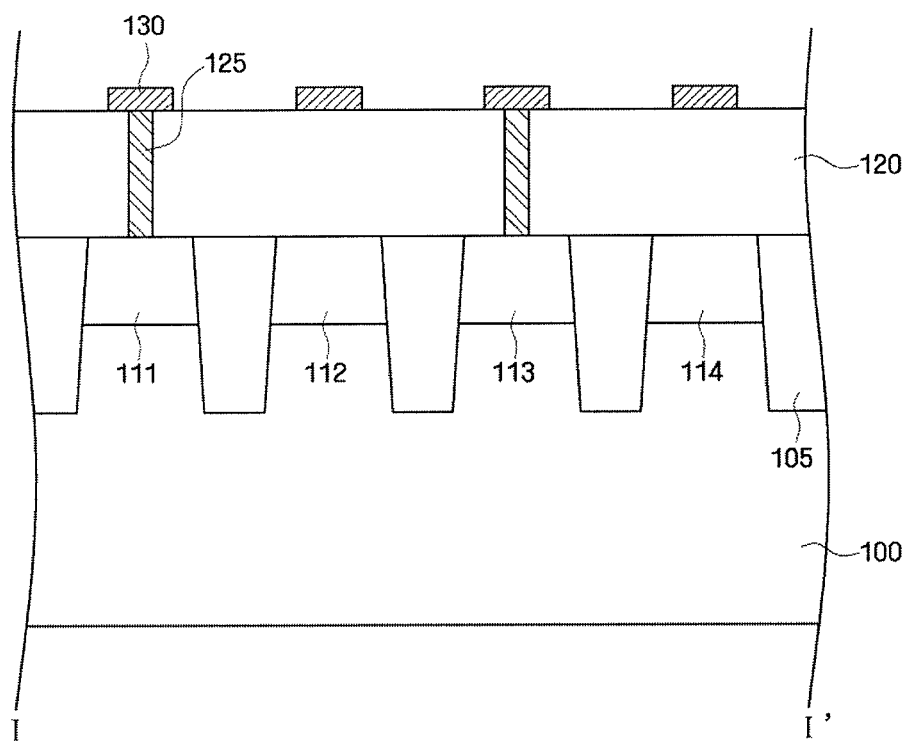

Referring to FIG. 15, a conductive material is filled into the first contact holes 123, thereby forming contact plugs 125. Next, conductive pads 130 are formed on the first insulation film 120. The conductive pads 130 may be formed by depositing a conductive material on the first insulation film 120 including the contact plugs 125 and patterning the same. The conductive pads 130 are formed at each memory cell region to be formed by crossings of the doping lines 111, 112, 113, and 114 and the subsequently formed wires (151, 152, 153, and 154 of FIG. 1).

Figure 16:
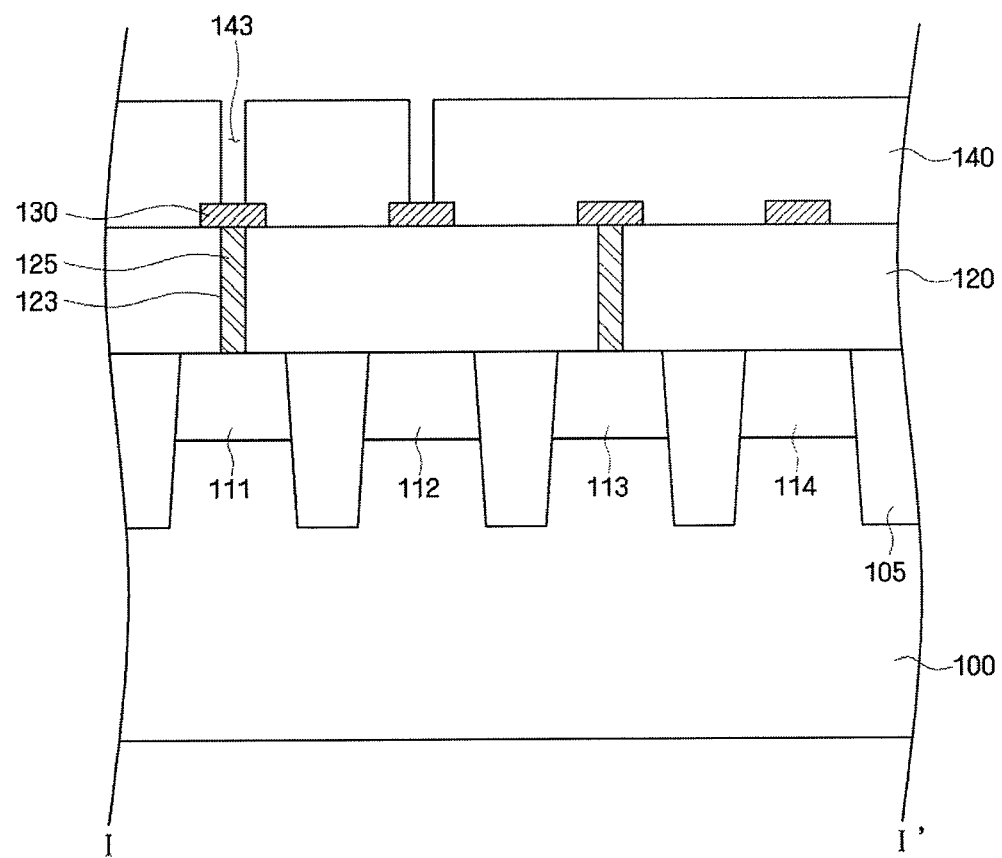

Referring to FIG. 16, a second insulation film 140 is formed on the entire surface of the substrate 100 having the conductive pads 130. Subsequently, second contact holes 143 exposing predetermined regions of the conductive pads 130 are formed defining cells to be selected according to the code data received from a consumer, etc. The second contact holes 143 may be formed by patterning the second insulation film 140.

Referring back to FIG. 2, a conductive material is filled into the second contact holes 143, forming vias 145. Next, wires 151, 152, 153, and 154 are formed on the second insulation film 140. The wires 151, 152, 153, and 154 may be formed to cross the doping lines 111, 112, 113, and 114, and may be fanned by patterning a conductive material formed on the second insulation film 140.

Figure 17:
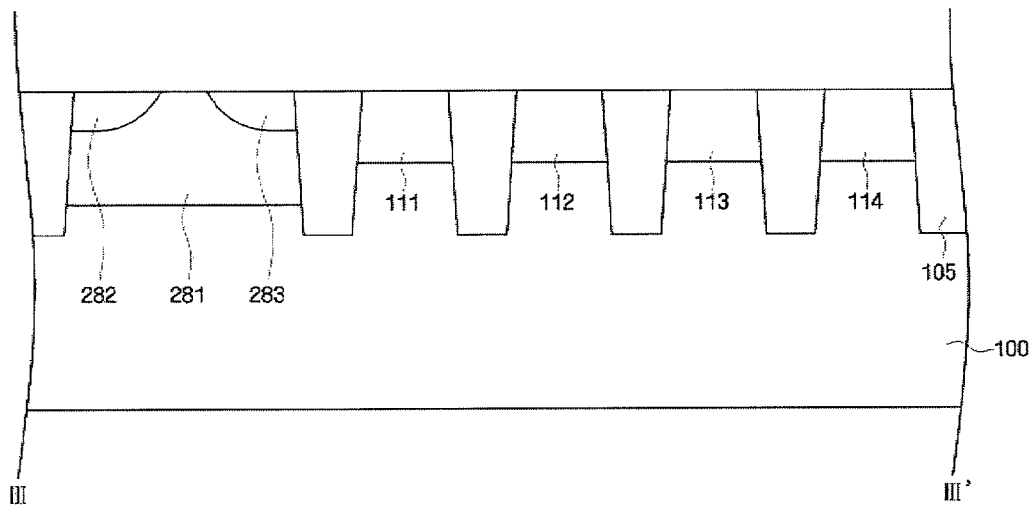
FIGS. 17 and 18 are sectional views illustrating a method for forming the mask ROM shown in FIGS. 4 and 5.
Figure 18:
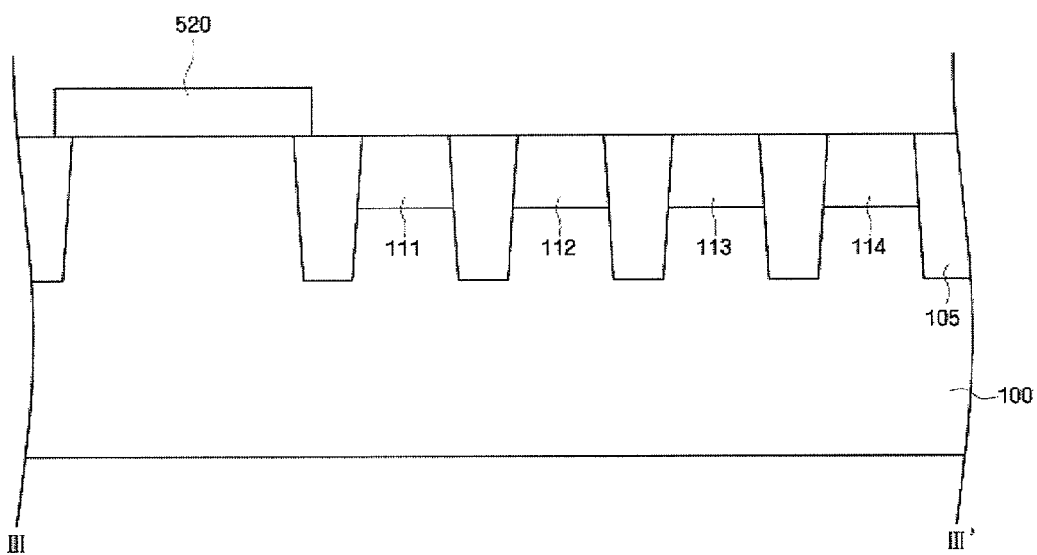

A method for forming a mask ROM according to another embodiment of the present disclosure will now be described with reference to FIGS. 3, 4, 5 and 12 through 18. FIGS. 17 and 18 are sectional views illustrating a method for forming the mask ROM shown in FIGS. 4 and 5. The same reference numerals are used to refer to substantially the same elements as those shown in FIGS. 4 and 5, and detailed explanation thereof may be omitted.

As previously described with reference to FIGS. 12 and 13, the isolation film 105 and the doping lines 111, 112, 113, and 114 are formed in the substrate 100.

Referring to FIGS. 17 and 18, a mask pattern 520 is formed at one end of the substrate in a region where the fake pass transistor second decoder (274 of FIG. 3) will be formed. Next, impurities are implanted into the substrate 100 at the one end of the substrate to form the wells 281 and the source/drain regions 282 and 283 of the pass transistor of the second decoders (271, 272, 273 of FIG. 3) in the regions not covered by the mask pattern 520. Although not shown, a similar technique may be used to form the select transistors of the first decoders 161, 163, and 164 and the fake select transistor first decoder 362 of FIG. 7.

Referring to FIGS. 4 and 5, the second gate electrode 280 is formed on the substrate 100 over the wells 281. Next, the first insulation film 120, the first contact holes 123, the contact plugs 125, the conductive pads 130, the second insulation film 140, the second contact holes 143, the vias 145, and the wires 151 to 154, are formed, as previously described with reference to FIGS. 14 through 16.

Methods for forming the mask ROMs according to other embodiments of the present disclosure can be deduced by one skilled in the art from exemplary methods for forming the mask ROMs according to previous embodiments of the present disclosure, and detailed descriptions thereof will be omitted.

While embodiments of the present disclosure have been particularly shown and described with reference to exemplary embodiments thereof, it will be understood by those of ordinary skill in the art that various changes in form and details may be made therein without departing from the spirit and scope of the present disclosure as defined by the following claims. It is therefore desired that the present embodiments be considered in all respects as illustrative and not restrictive, reference being made to the appended claims rather than the foregoing description to indicate the scope of the embodiments of the disclosure.

What is claimed is:

1. A mask read-only memory (ROM) comprising:
   a plurality of doping lines of a second conductivity type formed in a substrate of a first conductivity type and spaced apart from each other in parallel;
   first decoders connected to one end of each of the plurality of doping lines, wherein some of the first decoders are formed of select transistors and at least one of the first decoders is formed of a fake select transistor different from the select transistor;
   a first insulation film formed on the doping lines and the substrate;
   a plurality of conductive pads formed on the first insulation film;
   a second insulation film formed on the first insulation film and the conductive pads;
   a plurality of wires formed on the second insulation film, spaced apart from each other in parallel, and extending perpendicular to the doping lines;
   a plurality of contact plugs formed in the first insulation film and electrically connecting some, but not all of the doping lines to some, but not all of the conductive pads; and
   a plurality of vias formed in the second insulation film and electrically connecting some, but not all of the conductive pads to some, but not all of the wires,
   wherein crossings of the doping lines and the wires define memory cells, wherein the contact plugs and the vias are formed in memory cells of a first type, and wherein at least one of the contact plug and the via are missing from memory cells of a second type.

2. The mask ROM of claim 1, wherein the conductive pads are formed at locations corresponding to crossings of the doping lines and the wires.

3. The mask ROM of claim 1, wherein the memory cells include diodes formed in the substrate.

4. The mask ROM of claim 1, wherein the first type memory cells are on-memory cells, and the second type memory cells are off-memory cells.

5. The mask ROM of claim 1, wherein the select transistor includes a well and source and drain regions formed in the doping lines and the fake select transistor lacks the well and the source and drain regions.

6. The mask ROM of claim 1, wherein the select transistor is a MOS transistor of a first conductivity type, and the fake pass transistor is a MOS transistor of a different second conductivity type.

7. The mask ROM of claim 1, wherein the select transistor and the fake select transistor have different threshold voltages.

8. The mask ROM of claim 1, further comprising an isolation film formed in the substrate between the plurality of doping lines.

9. The mask ROM of claim 7, wherein the threshold voltage of the fake select transistor is greater than that applied to the gate electrode of the fake select transistor.

10. A mask read-only memory (ROM) comprising:
   a plurality of doping lines of a second conductivity type formed in a substrate of a first conductivity type and spaced apart from each other in parallel;
   a first insulation film formed on the doping lines and the substrate;
   a plurality of conductive pads formed on the first insulation film;
   a second insulation film formed on the first insulation film and the conductive pads;
   a plurality of wires formed on the second insulation film, spaced apart from each other in parallel, and extending perpendicular to the doping lines;
   second decoders connected to one end of each of the plurality of wires, wherein some of the second decoders are formed of a pass transistor, and at least one of the second decoders is formed of a fake pass transistor;
   a plurality of contact plugs formed in the first insulation film and electrically connecting some but not all of the doping lines to some, but not all of the conductive pads; and
   a plurality of vias formed in the second insulation film and electrically connecting some, but not all of the conductive pads to some, but not all of the wires,
   wherein crossings of the doping lines and the wires define memory cells, wherein the contact plugs and the vias are formed in memory cells of a first type, and wherein at least one of the contact plug and the via are missing from memory cells of a second type.

11. The mask ROM of claim 10, wherein the pass transistor includes a well and source and drain regions formed in the substrate, and the fake pass transistor lacks the well and the source and drain regions.

12. The mask ROM of claim 10, wherein the pass transistor is a MOS transistor of a first conductivity type, and the fake pass transistor is a MOS transistor of a different second conductivity type.

13. The mask ROM of claim 10, wherein the pass transistor and the fake pass transistor have different threshold voltages.

14. The mask ROM of claim 13, wherein the threshold voltage of the fake pass transistor is greater than that applied to a gate electrode of the fake pass transistor.

15. A mask ROM comprising:
   a plurality of doping lines of a second conductivity type formed in a substrate of a first conductivity type and spaced apart from each other in parallel;
   first and second insulation films sequentially formed on the second conductivity type doping lines and the substrate;
   a plurality of wires formed on the second insulation film, spaced apart from each other in parallel, and extending perpendicular to the doping lines;
   a plurality of conductive pads formed on the first insulation film to correspond to crossings of the doping lines and the wires,
   wherein the crossings of the doping lines and the wires define memory cells, wherein memory cells of a first type have the doping lines electrically connected to the wires, and memory cells of a second type have the doping lines electrically disconnected from the wires, wherein the electrical connections comprise a connection between the doping lines and the conductive pads and a connection between the conductive pads and the wires, and first decoders connected to one end of the plurality of doping lines, wherein some of the first decoders are formed of select transistors and at least one of the first decoders is formed of a fake select transistor.

16. The mask ROM of claim 15, further comprising second decoders connected to one end of the plurality of wires.

17. The mask ROM of claim 15, wherein electrically disconnecting the doping lines from the wires comprises disconnecting at least one of the connection between the doping lines and the conductive pads and the connection between the conductive pads and the wires.

18. The mask ROM of claim 16, wherein some of the second decoders are formed of a pass transistor, and at least one of the second decoders is formed of a fake pass transistor.

* * * * *